United States Patent [19]

Blakeslee et al.

[11] 4,088,515
[45] May 9, 1978

[54] METHOD OF MAKING SEMICONDUCTOR SUPERLATTICES FREE OF MISFIT DISLOCATIONS

[75] Inventors: A. Eugene Blakeslee, Mount Kisco; John Wauchope Matthews, Ossining, both of N.Y.

[73] Assignee: International Business Machines Corporation, Armonk, N.Y.

[21] Appl. No.: 565,298

[22] Filed: Apr. 4, 1975

Related U.S. Application Data

[63] Continuation of Ser. No. 351,722, Apr. 15, 1973, abandoned.

[51] Int. Cl.$^2$ ............... H01L 21/20; H01L 29/06
[52] U.S. Cl. ................... 148/175; 148/1.5; 148/171; 156/610; 156/612; 357/4; 357/16
[58] Field of Search ........... 148/175, 1.5, 171–173; 156/610, 612; 357/4, 16

[56] References Cited

U.S. PATENT DOCUMENTS

| | | | |
|---|---|---|---|
| 3,309,553 | 3/1967 | Kroemer | 357/16 X |
| 3,322,575 | 5/1967 | Ruehrwein | 148/175 X |
| 3,626,257 | 12/1971 | Esaki et al. | 357/16 X |
| 3,626,328 | 12/1971 | Esaki et al. | 357/16 X |
| 3,691,476 | 9/1972 | Hayashi | 357/16 X |
| 3,696,262 | 10/1972 | Antypas | 357/16 X |
| 3,721,583 | 3/1973 | Blakeslee | 148/175 X |
| 3,752,713 | 8/1973 | Sakuta et al. | 357/16 X |
| 3,821,033 | 6/1972 | Hu | 148/175 |

OTHER PUBLICATIONS

Abrahams et al., "Stresses in Heteroepitaxial Layers: GaAs$_{rx}$P$_x$ on GaAs" J. Applied Physics, vol. 40, No. 9, Aug. 1969, pp. 3754–3758.

Abrahams et al., "Dislocation Morphology in Graded Heterojunctions: GaAs$_{rx}$P$_x$," J. of Materials Science, vol. 4, 1969, pp. 223–235.

Blakeslee, A. E., "Vapor Growth of a Semiconductor Superlattice" J. Electrochem. Soc., vol. 118, No. 9, Sep. 1971, pp. 1459–1463.

Ewing et al., "Compositional Inhomogeneities in GaAs$_{rx}$P$_x$ Alloy Epitaxial Layers" J. Applied Physics, vol. 39, No. 13, Dec. 1968, pp. 5943–5948.

*Primary Examiner*—L. Dewayne Rutledge
*Assistant Examiner*—W.G. Saba
*Attorney, Agent, or Firm*—John O'Flaherty; John W. Henderson; Bernard N. Wiener

[57] ABSTRACT

A method of growing superlattice crystals containing alternating layers of two semiconductor materials in which misfit and threading dislocations are eliminated by growing the layers of superlattice crystal to some thickness less than that which will generate new dislocations, and matching the average lattice parameter of the superlattice with that of substrate so misfit dislocations between the superlattice and the substrate are not formed.

33 Claims, 1 Drawing Figure

METHOD OF MAKING SEMICONDUCTOR SUPERLATTICES FREE OF MISFIT DISLOCATIONS

This is a continuation of application Ser. No. 351,722 filed Apr. 15, 1973; now abandoned.

BACKGROUND OF THE INVENTION

Prior Art

Esaki and Tsu in U.S. Pat. Nos. 3,626,257 and 3,626,328, have described semiconducting devices having a superlattice structure in which there is a periodic variation in semiconductor composition. Theoretically predicted non-linear electron transport phenomena are assumed to arise from the periodic conduction band potential which is produced by constructing a crystal containing alternating ultrathin layers of two semiconducting materials with different band gaps.

The layered superlattice structure may be formed by either doping or alloying techniques. In doping, a superlattice structure is produced by epitaxially growing a semiconductor material such as germanium, which is periodically doped so as to produce alternating ultrathin layers having different conductivity types, viz. $p$ or $n$.

The alternate technique is to grow ultrathin layers with varying alloy compositions. Alternating layers of Group IV element alloys such as $Ge_{1-x}Si_x$ may be used where $x$ alternates between two values which lie between 0 and 1. Group III-V alloys may also be employed. Thus, $III_{1-x}III_xV$ alloys such as $Ga_{1-x}Al_xAs$ or $In_{1-x}Ga_xAs$ and $III$ $V_{1-x}V_x$ alloys such as $GaAs_{1-x}P_x$ where $x$ alternates between two values which lie between 0 and 1 are suitable semiconductor materials for the production of superlattices.

A system investigated extensively has been $GaAs_{1-x}P_x$ where $x$ alternates between 0 and 0.5. In this system, the respective layers 16A and 16B as shown in FIG. 1 are GaAs, with a lattice parameter $a_o = 5.65A$, and $GaAs_{.5}P_{.5}$, with $a_o = 5.55A$. It has been found that the strain occasioned by the difference in lattice parameters causes a high density of dislocations to be formed. The dislocations may be characterized as either threading or misfit dislocations. Misfit dislocations lie strictly within the plane of mismatch, and their presence there accommodates some of the misfit and thus relieves elastic strain.

We have discovered that there are two types of misfit dislocations in $GaAs/GaAs_{.5}P_{.5}$ superlattice structures produced on a GaAs substrate. Dislocations of the first type (I) occur at the interfaces between successive thin layers in order to accommodate the sudden change in lattice parameter there; those of the second type (II) occur in the interface between the superlattice and its substrate. They are due to the misfit between the substrate and the superlattice taken as a whole. The misfit of Type I is given by:

$$f_I = (a_A - a_B/a_{SL}) \quad (1)$$

where $a_A$ and $a_B$ are the lattice parameters of the individual thin layers and $a_{SL}$ is the average lattice parameter of the superlattice. Misfit of Type II is:

$$f_{II} = (a_S - a_{SL}/a_{SL}) \quad (2)$$

where $a_S$ is the lattice parameter of the substrate. If the thicknesses of the component layers A and B of the superlattice are approximately equal, $$a_{SL} = \tfrac{1}{2}(a_A + a_B) \quad (3)$$

otherwise $a_{SL}$ is some average of $a_A$ and $a_B$ weighted according to thickness.

Threading dislocations propagate with a component of their orientation in the direction of crystal growth. The overwhelming majority of them are formed by a bending of misfit dislocations of Type I and II out of the mismatch plane. Since diffusion coefficients are greatly enhanced along dislocations, these threading dislocations can serve as diffusion "pipes" in which the abrupt changes in concentration of the As and P species necessary to produce the required periodic conduction band are greatly reduced. The diffusion "pipes" will effectively short out the potential barriers between adjacent layers and lead to an ohmic current-voltage characteristic.

Interfaces between parallel crystals in perfect contact are either coherent or incoherent. They are coherent if the crystals are elastically strained to bring their lattices into register at the interface and incoherent if the lattices are not in register. Disregistry indicates that misfit dislocations and therefore threading dislocations are present.

It is an object of this invention to grow coherent superlattice structures.

It is yet another object of this invention to grow a superlattice structure having abrupt changes in concentration between layers.

It is still another object of this invention to minimize or eliminate threading and misfit dislocations.

SUMMARY OF THE INVENTION

The above objects are accomplished by eliminating misfit dislocations which occur between successive thin layers by growing the layers to less than a critical thickness at which new dislocations would be spontaneously generated. The prevention of such misfit dislocations eliminates the occurrence of threading dislocations which form from the bending upward of misfit dislocations.

Misfit dislocations between the substrate and the multilayer may be eliminated by matching the lattice parameter of the substrate with the average lattice parameter of the superlattice. This is accomplished by adjusting the thickness or the stoichiometry between layers so that the average lattice parameter of the superlattice is equal to the lattice parameter of the substrate.

Where the base substrate wafer is of such a composition that it would be impossible to match the lattice parameter of the superlattice or of the multilayer with that of the substrate, an additional substrate layer with a lattice parameter equal to the average lattice parameter of the multilayer may be grown by gradually changing the composition from that of the base substrate composition to a composition which matches the average lattice parameters of the multilayer.

The foregoing and other objects, features and advantages of the invention will be apparent from the following more particular description of the preferred embodiment of the invention as illustrated in the accompanying drawing.

PREFERRED EMBODIMENT

Figure 1:
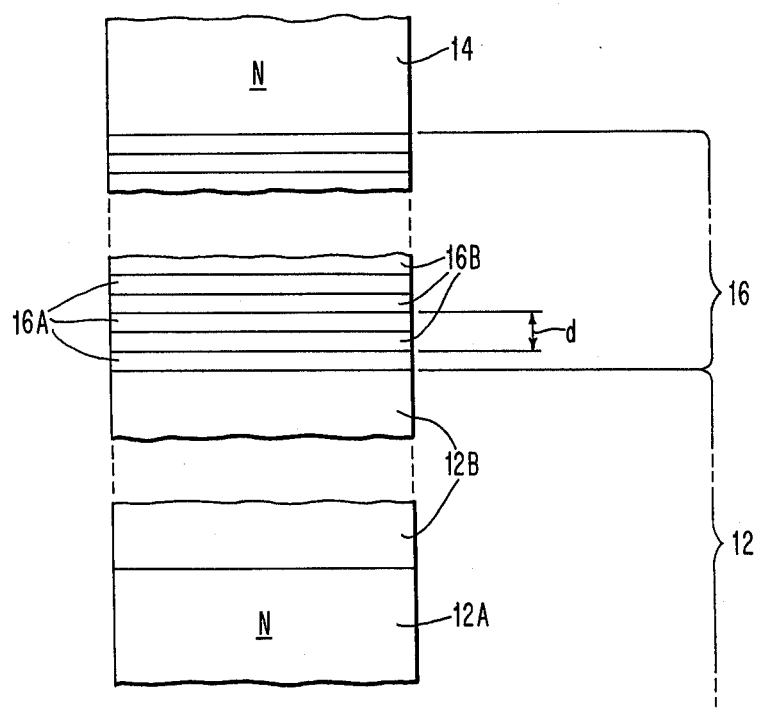
FIG. 1 represents the multilayer structure of a semiconductor superlattice device.

The thickness of the individual layers forming the superlattice must, if the interfaces are to remain coherent, and no misfit dislocations are to be generated in them, be smaller than a critical value. This critical value has been calculated. The methods used in the calculation are similar to those employed by W. A. Jesser and J. W. Matthews, *Phil. Mag.* 15, 1097 (1967). The critical thickness is found to be $$h_c = 4Q/Pf_I$$

where $$P = \frac{2G(1 + \nu)\cos\lambda}{1 - \nu}$$

and $$Q = \frac{Gb^2}{4\pi(1 - \nu)}(\ln\frac{h}{b} + 1)$$

wherein G is the sheer modulus of the layers, $\nu$ is Poisson's ratio, $f_I$ is the misfit between the layers, $\lambda$ is the angle between the slip direction and that direction in the film plane which is perpendicular to the line of intersection of the slip plane and the specimen surface, $b$ is the Burger's vector, and $h$ is the thickness of the layers. The critical thickness predicted by these expressions for the system GaAs/GaAs$_{1-x}$P$_x$ where $f_I = 0.018$ is $h_c = 350A$.

Therefore, if the layer thicknesses are kept less than this critical value, misfit dislocations will not be introduced, and the interfaces present in the superlattice are then coherent. Since a superlattice period $d$, as shown in FIG. 1, consists of two layers with opposite strain, in which layer 16A is GaAs, and layer 16B is GaAs$_{1-x}$P$_x$ the period should be less than 700A in order to ensure coherence.

Type II misfit dislocations will not be formed if the misfit $f_{II}$ in Equation (2) is reduced to zero by making $a_S = a_{SL}$. We achieve the desired condition by growing a crystal of GaAs$_{1-y}$P$_y$, 12B of FIG. 1, for a substrate and then growing a coherent GaAs/GaAs$_{1-x}$P$_x$ superlattice on top of that. The phosphorus mole fraction $y$ in the substrate must equal its average value in the superlattice. In the simplest case where layers of GaAs and GaAs$_{1-x}$P$_x$, 16A and 16B of FIG. 1, are of equal thickness, $y = x/2$. Where the layers are of unequal thickness, the stoichiometry represented by $x$ and $y$ is adjusted accordingly.

Since, in the current technology, the substrate crystals generally available are GaAs, shown as 12A in FIG. 1, a final layer of GaAs$_{1-y}$P$_y$, 12B of FIG. 1, is grown in order to bring the lattice parameter of the substrate equal to the average lattice parameter of the superlattice structure. In order to prevent the formation of threading dislocations during the growth of this layer the composition of the layer should change gradually from that of GaAs to the average composition of the superlattice. In some cases the growth of this graded layer on the substrate will remove all threading dislocations by the process described fully in U.S. Patent application Ser. No. 231,695, filed Mar. 3, 1972, now U.S. Pat. No. 3,788,890 issued Jan. 29, 1974.

FIG. 1 is a representation of the superlattice structure of a device. The substrate 12 may be highly doped with a suitable dopant such as S to be strongly N type. Base substrate layer 12A may be readily available crystal such as GaAs. Layer 12B should have a gradation in composition from GaAs to GaAs$_{1-y}$P$_y$ so as to minimize or eliminate threading dislocations. Layers 16A would then represent GaAs layers while layers 16B represent GaAs$_{1-x}$P$_x$ layers, the superlattice, 16, being N type and having an average lattice parameter equal to the lattice parameter of the final substrate layer 12B. The superlattice may then be "capped" with another thick strongly N type portion of GaAs$_{1-y}$P$_y$, 14, to facilitate making ohmic contact to the device.

A method of making GaAs, GaAs$_{1-x}$P$_x$ superlattice is described by Blakeslee in U.S. Patent application Ser. No. 96,206 filed Dec. 8, 1970, now U.S. Pat. No. 3,721,583 issued Mar. 20, 1973, and assigned to the same assignee as the present invention, as well as in "Vapor Growth of Semiconductor Superlattice", J. Electrochem. Soc. 118, 1459 (1971).

While the invention has now been described with particularity, the following example is given as illustration.

EXAMPLE

GaAs - GaAs$_{0.5}$P$_{0.5}$ multilayers are prepared by chemical vapor deposition using the Ga - AsH$_3$ - PH$_3$ -HCl - H$_2$ vapor system. In this process GaCl is formed by reaction of Ga with HCl and transported by the H$_2$ carrier gas, together with either AsH$_3$ or AsH$_3$ + PH$_3$, into the deposition zone. Reactive deposition produces an epitaxial layer of GaAs or GaAs$_{.5}$P$_{.5}$ on the substrate surface. The details of the apparatus used to grow the alternating layers have been described in U.S. Patent application Ser. No. 96,206, filed Dec. 8, 1970. An important feature of it is the ability to inject PH$_3$ into an AsH$_3$ vapor stream in such a way that there is little mixing of the AsH$_3$ and AsH$_3$ + PH$_3$ pulses as they move to the deposition zone. The duration of the injection of PH$_3$ is controlled by a solenoid valve activated by an electronic timer. The relative thicknesses of the GaAs and GaAs$_{.5}$P$_{.5}$ layers can be adjusted by varying the ratio of the off to on times.

The base substrates are chemically polished GaAs wafers. The wafer surface is inclined at between 2° and 3° to (001). The rotation away from (001) is about a 110 axis in (001). The density of dislocations in the substrates is always less than $5 \times 10^4$/cm$^2$ and usually less than $1 \times 10^4$/cm$^2$. The temperature during the deposition of the multilayers is 750° C.

An epitaxial layer serving as a secondary substrate is grown over the GaAs wafer. The composition of this layer gradually changes from pure GaAs to GaAs$_{.75}$P$_{.25}$ to give a lattice parameter of approximately 5.60A, thereby matching the final lattice parameter of the substrate to the average lattice parameter of the multilayer to be grown upon it.

The gradual increase in the P content of the secondary substrate is achieved by gradually increasing the flow of PH$_3$ so that a compositional gradient of approximately 1%/micron is obtained. Thus, after approximately 25 microns, the final substrate layer composition, GaAs$_{.75}$P$_{.25}$ is achieved. An additional 5 microns of GaAs$_{.75}$P$_{.25}$ is grown before the growth of the multilayer. To achieve strong N conductivity in the substrate, the substrate layers are doped with approximately 10$^{18}$ atoms/c.c. of S.

In the growth of the multilayer, the on time and off time of the PH$_3$ gas are equal in order to obtain equal thicknesses of GaAs and GaAs$_{.5}$P$_{.5}$ layers. In a typical example, the multilayers may contain 60 layers and the layer thicknesses are approximately 300A. Layer thickness may be determined from scanning electron micrographs of the multilayers viewed from the side, or from the positions of satellite peaks in x-ray diffraction patterns.

A final strongly N type cap of $GaAs_{.75}P_{.25}$ is grown over the multilayer to facilitate electrical connection.

Though the preferred embodiments use N type material and the interaction is that of electrons with the periodic potential of the conduction band, the invention may also be practiced with P type material in which holes interact with the periodic potential of the valence band.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for forming a coherent, substantially dislocation free multilayer crystal comprising the steps of:

selecting a suitable substrate crystal; and depositing on said substrate crystal a plurality of alternate layers of a first and second crystalline material with different lattice parameters, wherein the alternating layers comprise alloy compositions $IV_{1-x}IV_x$, $III_{1-x}III_xV$, excluding said $III_{1-x}$ and said $III_x$ being Ga and Al, or $III\ V_{1-x}V_x$, wherein $x$ alternates in successive layers between two values both of which lie between 0 and 1 and III, IV, and V represent elements of Groups IIIa, IVa, Va respectively, of the Periodic Table, said layers being of less than a maximum critical thickness given by $h_c = 4Qa_{SL}/P(a_A - a_B)$ and having an average lattice parameter equal to the lattice parameter of the substrate.

2. The process of claim 1 where said crystal is a superlattice.

3. A process for forming a coherent, substantially dislocation free multilayer crystal having the general formula $A_{1-x}B/A_{1-x'}B_{x'}$ wherein A and B are selected from Group IVa elements and $x$ and $x'$ alternate in successive layers between two values both of which lie between 0 and 1, comprising the steps of:

selecting a suitable substrate having the general formula A;

depositing on said substrate a secondary layer in which there is a compositional gradient from A to $A_{1-y}B_y$; and depositing on said secondary layer alternate layers $A_{1-x}B_x/A_{1-x'}B_{x'}$ of less than their maximum critical thicknesses where these thicknesses and the values of $x$ and $x'$ are such that the multilayer average lattice parameter is equal to the final lattice parameter of the graded secondary layer.

4. The process of claim 3 wherein said crystal is a superlattice.

5. A process as set forth in claim 3 wherein said Group IVa elements comprise Si and Ge.

6. A process for forming a coherent, substantially dislocation free multilayer crystal having the general formula $A_{1-x}B_x/A_{1-x'}B_{x'}$ wherein A and B are selected from the Group IVa elements and $x$ and $x'$ alternate in successive layers between two values both of which lie between 0 and 1, comprising the steps of:

providing a substrate having the general formula $A_{1-y}B_y$; and depositing on said substrate alternate layers $A_{1-x}B_x/A_{1-x'}B_{x'}$ of less than their maximum critical thicknesses where these thicknesses and the values of $x$ and $x'$ are such that the multilayer average lattice parameter is equal to the lattice parameter of the substrate.

7. The process of claim 6 where said crystal is a superlattice.

8. A process as set forth in claim 6 wherein said Group IVa elements comprise Si and Ge.

9. A process for forming a coherent, substantially dislocation free multilayer crystal having the general formula $A_{1-x}B_xC/A_{1-x'}B_{x'}C$ wherein A and B are selected from Group IIIa elements comprising In, Ga, Al Boron, excluding A and B being Ga and Al, and C is selected from Group Va elements comprising N, P, As, Sb, and successive alternate layers have different lattice parameters, comprising steps of:

selecting a suitable substrate having the general formula AC;

depositing on said substrate a secondary layer in which there is a compositional gradient from AC to $A_{1-y}B_yC$; and depositing on said secondary layer alternate layers $A_{1-x}B_xC$ and $A_{1-x'}B_{x'}C$ of less than their maximum critical thicknesses where these thicknesses and the values of $x$, $x'$ and $y$ are such that the multilayer average lattice parameter is equal to the final lattice parameter of the graded secondary layer.

10. The process of claim 9 where said crystal is a superlattice.

11. A process for forming a coherent, substantially dislocation free multilayer crystal having the general formula $A_{1-x}B_xC/A_{1-x'}B_{x'}C$ wherein A and B are selected from Group IIIa elements comprising In, Ga, Al, Boron, excluding A and B being Ga and Al, and C is selected from Group Va elements comprising N, P, As, Sb, and successive alternate layers have different lattice parameters, comprising the steps of:

providing a substrate layer having the general formula $A_{1-y}B_yC$; and depositing on said substrate alternate layers $X_{1-x}B_xC$ and $A_{1-x'}B_{x'}C$ of less than their maximum critical thicknesses where these thicknesses and the values of $x$, $x'$ and $y$ are such that the multilayer average lattice parameters are equal to the lattice parameter of the substrate.

12. The process of claim 11 where said crystal is a superlattice.

13. A process for forming a coherent, substantially dislocation free multilayer crystal having the general formula $AC_{1-x}D_x/AC_{1-x'}D_{x'}$ wherein A is selected from Group IIIa elements comprising In, Ga, Al, Boron and C and D are selected from Group Va elements comprising N, P, As, Sb, comprising the steps of:

providing a suitable substrate having the general formula AC;

depositing on said substrate layer a second layer in which there is a compositional gradient from AC to $AC_{1-y}D_y$; and producing on said secondary layer alternate layers $AC_{1-x}D_x$ and $AC_{1-x'}D_{x'}$ of less than their maximum critical thicknesses where these thicknesses and the values of $x$, $x'$ and $y$ are such that the multilayer average lattice parameter is equal to the final lattice parameter of the graded secondary layer.

14. The process of claim 13 where said crystal is a superlattice.

15. A process for forming a coherent, substantially dislocation free multilayer crystal having the general formula $AC_{1-x}D_x/AC_{1-x'}D_{x'}$, wherein A is selected from Group IIIa elements comprising In, Ga, Al, Boron and C and D are selected from Group Va elements comprising N, P, As, Sb, comprising the steps of:
   selecting a substrate layer having the general formula $AC_{1-y}D_y$; and
   producing on said substrate alternate layers $AC_{1-x}D_x$ and $AC_{1-x'}D_{x'}$, of less than their maximum critical thicknesses where these thicknesses and the values of $x$, $x'$ and $y$ are such that the multilayer average lattice parameters are equal to the lattice parameter of the substrate.

16. The process of claim 15 where said crystal is a superlattice

17. A process for forming a coherent, substantially dislocation free multilayer crystal having the general formula $A_{1-x}B_xC/A_{1-x'}B_{x'}C$ where A and B are selected from Group IIIa elements comprising In, Ga, Al, Boron, excluding A and B being Ga and Al, and C is selected from Group Va elements comprising N, P, As, Sb, and successive alternate layers have different lattice parameters, comprising the steps of:
   providing a suitable substrate having the general formula AC;
   depositing on said substrate a secondary layer in which there is a compositional gradient from AC to $AC_{1-y}D_y$, wherein D is slected from Group Va elements comprising N, P, As, Sb; and
   depositing on said secondary layer alternate layers $A_{1-x}B_xC/A_{1-x'}B_{x'}C$ of less than their maximum critical thickness where these thicknesses and the values of $x$, $x'$ and $y$ are such that the multilayer average lattice parameter is equal to the final lattice parameter of the graded secondary layer.

18. The process of claim 17 where said crystal is a superlattice.

19. The process of forming a coherent, substantially dislocation free multilayer crystal having the general formula $A_{1-x}B_xC/A_{1-x'}B_{x'}C$ wherein A and B are selected from the Group IIIa elements comprising In, Ga, Al, Boron, exluding A and B being Ga and Al, and C is selected from group Va elements comprising N, P, As, Sb, and successive alternate layers have different lattice parameters, comprising the steps of:
   providing a substrate layer having the general formula $AC_{1-y}D_y$, where D is selected from Group Va elements comprising N, P, As, Sb; and
   producing on said substrate alternate layers $A_{1-x}B_xC/A_{1-x'}B_{x'}C$ of less than their maximum critical thicknesses, where the values of $x$, $x'$ and $y$ are such that the multilayer average lattice parameter is equal to the lattice parameter of the substrate.

20. The process of claim 19 where said crystal is a superlattice.

21. A process for forming a coherent, substantially dislocation free multilayer crystal having the general formula $AC_{1-x}D_x/AC_{1-x'}D_{x'}$, wherein A is selected from the Group IIIa elements comprising In, Ga, Al, Boron and C and D are selected from Group Va elements comprising N, P, As, Sb, comprising the steps of:
   providing a suitable substrate having the general formula AC;
   producing on said substrate layer a graded secondary layer in which there is a compositional gradient from AC to $A_{1-y}B_yC$, where B is selected from Group IIIa elements comprising N, P, As, Sb; and
   producing on said secondary layer alternate layers $AC_{1-x}D_x/AC_{1-x'}D_{x'}$, of less than their maximum critical thickness, where these thicknesses and the values of $x$, $x'$ and $y$ are such that the multilayer average lattice parameter is equal to the final lattice parameter of the graded secondary layer.

22. The process of claim 21 where said crystal is a superlattice.

23. A process for forming a coherent, substantially dislocation free multilayer cryatal having the general formula $AC_{1-x}D_x/AC_{1-x'}D_{x'}$, wherein A is selected from Group IIIa elements comprising In, Ga, Al, Boron and C and D are selected from Group Va elements comprising N, P, As, Sb, comprising the steps of:
   providing a substrate layer having the general formula $A_{1-y}B_yC$, wherein B is selected from Group IIIa elements comprising N, P, As, Sb; and
   depositing on said substrate alternate layers $AC_{1-x}D_x/AC_{1-x'}D_{x'}$, of less than their maximum critical thicknesses, where the values of $x$, $x'$ and $y$ are such that the multilayer average lattice parameter is equal to the lattice parameter of the substrate.

24. The process of claim 23 where said crystal is a superlattice.

25. The process of forming a coherent, substantially dislocation free $GaAs/GaAs_{1-x}P_x$ multilayer crystal comprising the steps of:
   providing a $GaAs_{1-y}P_y$ substrate; and
   depositing on said substrate alternate layers GaAs and $GaAs_{1-x}P_x$, said layers being of thicknesses of less than 350A and these thicknesses and the values of $x$ and $y$ are such that the multilayer average lattice parameter is equal to the lattice parameter of the substrate.

26. The process of claim 25 where said crystal is a superlattice.

27. A process for forming a coherent, substantially dislocation free $GaAs_{1-x}P_x/GaAs$ Multilayer crystal, comprising the steps of:
   providing a GaAs substrate;
   depositing on said substrate a secondary layer in which there is a compositional gradient from GaAs to $GaAs_{1-y}P_y$; and
   depositing on said secondary layer alternate layers of Ga As and $GaAs_{1-x}P_x$, said layers being of thicknesses of less than 350A and wherein these thicknesses and the value of $x$ and $y$ are such that the multilayer average lattice parameter is equal to the final lattice parameter of the graded secondary layer.

28. The process of claim 27 where said crystal is a superlattice.

29. The process of claim 28, wherein $x$ is approximately 0.5, $y$ is approximately 0.25 and each layer is of equal thickness.

30. The process of claim 29 where said crystal is a superlattice.

31. In a gaseous phase process for forming on a substrate a multilayer epitaxial structure comprising layers of a different epitaxial material selected from the group consisting of materials represented by the formula $A_xB_{1-x}$, wherein A and B represent different elemental components selected from Group IVa of the Periodic Table, and $AB_xC_{1-x}$, wherein A, B and C represent different elemental components selected from the group consisting of Groups IIIa, Va, excluding B and C being Ga and Al, of the Periodic Table, and wherein the value of $x$ in certain layers of said multilayer structures lies within the bounds of $0<x<1$, by (a) forming a first gaseous stream containing one or more of said elemental components in the form of a member selected from the group consisting of a gaseous element and a gaseous decomposable compound containing said element, (b) injecting said first gaseous stream into a second gaseous stream comprising a carrier gas and the remaining components of said epitaxial material to thereby form gaseous mixtures containing some or all components of said epitaxial material, said remaining components of said epitaxial material being different from said one or more components present in said first gaseous stream and being in the form of at least one member selected from the group consisting of a gaseous element and a gaseous decomposable compound containing said element and thereafter (c) contacting said gaseous mixtures with a substrate to cause deposition of said multilayer structure wherein $x$ varies from layer to layer to provide said multilayer structure, wherein one element is from Group IIIa of the Periodic Table, and at least one other element is from Group Va of the Periodic Table, or where both elements are from Group IVa of the Periodic Table, the improvement in said process which comprises:

controlling the thickness of said layers in said multilayer structure to less than a critical thickness determined by $h_c = 4Qa_{SL}/P(a_A-a_B)$; and adjusting the thicknesses of said layers to provide a multilayer having an average lattice parameter which equals the lattice parameter of said substrate.

32. In a gaseous phase process for forming a multilayer epitaxial structure on a substrate comprising layers of different epitaxial material selected from the group consisting of materials represented by the formula $A_xB_{1-x}$ and wherein A and B represent different elemental components selected from Group IVa of the Periodic Table, and $AB_xC_{1-x}$ wherein A, B and C represent different elemental components selected from the group consisting of Groups IIIa Va, excluding B and C being Ga and Al, of the Periodic Table, and wherein the value of $x$ in certain layers of said multilayer structure lies within the bounds of $0<x<1$, by (a) forming a first gaseous stream containing one or more of said elemental components in the form of a member selected from the group consisting of a gaseous element and a gaseous decomposable compound containing said element, (b) injecting said first gaseous stream into a second gaseous stream comprising a carrier gas and the remaining components of said epitaxial material to thereby form gaseous mixtures containing some or all components of said epitaxial material, said remaining components of said epitaxial material being different from said one or more components present in said first gaseous stream and being in the form of at least one member selected from the group consisting of a gaseous element and a gaseous decomposable compound containing said element and thereafter (c) contacting said gaseous mixtures with a substrate to cause deposition of said multilayer structure wherein $x$ varies from layer to layer to provide said multilayer structure, wherein one element is from Group IIIa of the Periodic Table, and at least one other element is from Group Va of the Periodic Table, or where both elements are from Group IVa of the Periodic Table, the improvement in said process which comprises:

the step of forming a graded secondary layer on top of said substrate prior to step (a) by forming a first gaseous stream comprising a carrier gas and the gaseous species contributing to one elemental component of said epitaxial material whose concentration is variable and increases monotonically with time from zero to a final maximum concentration and continuously injecting said first gaseous stream into a second gaseous stream comprising a carrier gas and the gaseous species contributing to the remaining components of said epitaxial material of the same composition as the substrate so that the lattice parameter of the graded substrate continuously varies from that of the substrate to a final lattice parameter;

controlling the thickness of said alternate layers in said multilayer structure to less than a critical thickness determined by $h_c = 4Qa_{SL}/P(a_A-a_B)$; and adjusting the thickness of said layers to provide a multilayer having an average lattice parameter equal to the final lattice parameter of said graded secondary layer.

33. In a continuous gaseous phase, high temperature process for forming on a substrate a multilayer comprising alternate layers of GaAs and $GaAs_{1-x}P_x$ wherein the value of $x$ in alternate layers varies between 0 and 1 by (a) forming a first gaseous stream comprising alternate pulses of carrier gas and $PH_3$, and (b) continuously injecting said pulses into a second gaseous stream comprising a carrier gas, $AsH_3$ and GaCl to thereby form alternate gaseous bursts containing Ga, As and P wherein the P is present at a maximum concentration separated by gaseous bursts wherein said P component is present at a minimum concentration and thereafter (c) contacting said gaseous bursts with a substrate to GaAs to cause deposition of said multilayer, the gaseous bursts containing all the Ga, As, and P components yielding a layer wherein $x$ is at a maximum, and the gaseous bursts wherein said P component is present at a minimum concentration yielding a layer wherein $x$ is at a minimum, and (d) maintaining a set residence time and interface contact area for said pulses and said bursts to control the degree of diffusion between said alternate pulses and said alternate bursts to provide said GaAs/$GaAs_{1-x}P_x$ multilayer, the improvement in said process which comprises the steps of:

forming a graded substrate layer on top of said substrate prior to step (a) by forming a first gaseous stream comprising a carrier gas in $PH_3$ whose concentration is variable and increases monotonically with time from zero to a final maximum concentration and continuously injecting said first gaseous stream into a second gaseous stream comprising a carrier gas and $AsH_3$ and GaCl so that the lattice parameter of the graded substrate continuoulsy varies from that of the substrate to a final lattice parameter;

controlling said residence time for said pulses and said bursts in step (d) to limit the thickness of said alternate layers in said superlattice structure to less than a critical thickness determined by $h_c = 4Qa_{SL}/P(a_A-a_B)$; and adjusting the ratio of the on times for said pulses and said bursts to provide a multilayer having an average lattice parameter equal to the final lattice parameter of said graded substrate.

* * * * *